Dec. 1, 1959 O. K. NILSSEN 2,915,631

SELF-TUNING FM DETECTOR CIRCUIT

Filed Oct. 8, 1956

INVENTOR.
OLE K. NILSSEN
BY H. W. Newton
ATTORNEY

United States Patent Office 2,915,631

Patented Dec. 1, 1959

2,915,631

SELF-TUNING FM DETECTOR CIRCUIT

Ole Kristian Nilssen, Collingswood, N.J., assignor to Radio Corporation of America, a corporation of Delaware Application October 8, 1956, Serial No. 614,494

3 Claims. (Cl. 250—27)

This invention relates to frequency modulation (FM) signal receivers and the like, and more particularly to a frequency modulation detector circuit of the type having a tuned signal input transformer.

Several types of FM detectors utilize a tuned signal input transformer which applies out-of-phase FM signal voltages to the FM detector means, such as, a discriminator circuit or a ratio detector circuit. The signal input transformer, in the case of a signal receiver, is tuned to the intermediate frequency (IF) signal. A slight change in either the IF signal frequency of the receiver or the tuning of the signal input transformer may seriously unbalance the detected output and cause distortion unless a wide band FM detector circuit is employed. However, if the tuning of the signal input transformer could be controlled automatically to center the tuning at the center frequency of the IF signal, such distortion would not occur. a relatively narrow band FM detector could be used. manual tuning of the receiver would be facilitated, and automatic frequency control of the local oscillator. as used in many superheterodyne FM receivers, could in some cases be eliminated.

It is therefore an object of the invention to provide an improved FM detector circuit for signal receivers and the like, that may respond automatically to signal frequency variations to provide center frequency tuning of the signal input transformer therefor.

It is another object of the invention to provide an improved circuit for automatically tuning the signal input transformer of an FM detector circuit in response to variations in the amplitude of the detected output signal voltage.

In accordance with the invention, an FM detector circuit utilizing a tuned signal input transformer to provide out-of-phase FM signal voltages includes a reverse bias crystal diode as part of the tuning capacitance for the transformer. The average value of the output voltage developed by the detector circuit in response to a received signal is applied to alter the reverse bias on the diode, thus changing its capacitance and automatically altering the tuning of the transformer to maintain the transformer tuned to the center frequency of the incoming FM signal.

Figure 1:
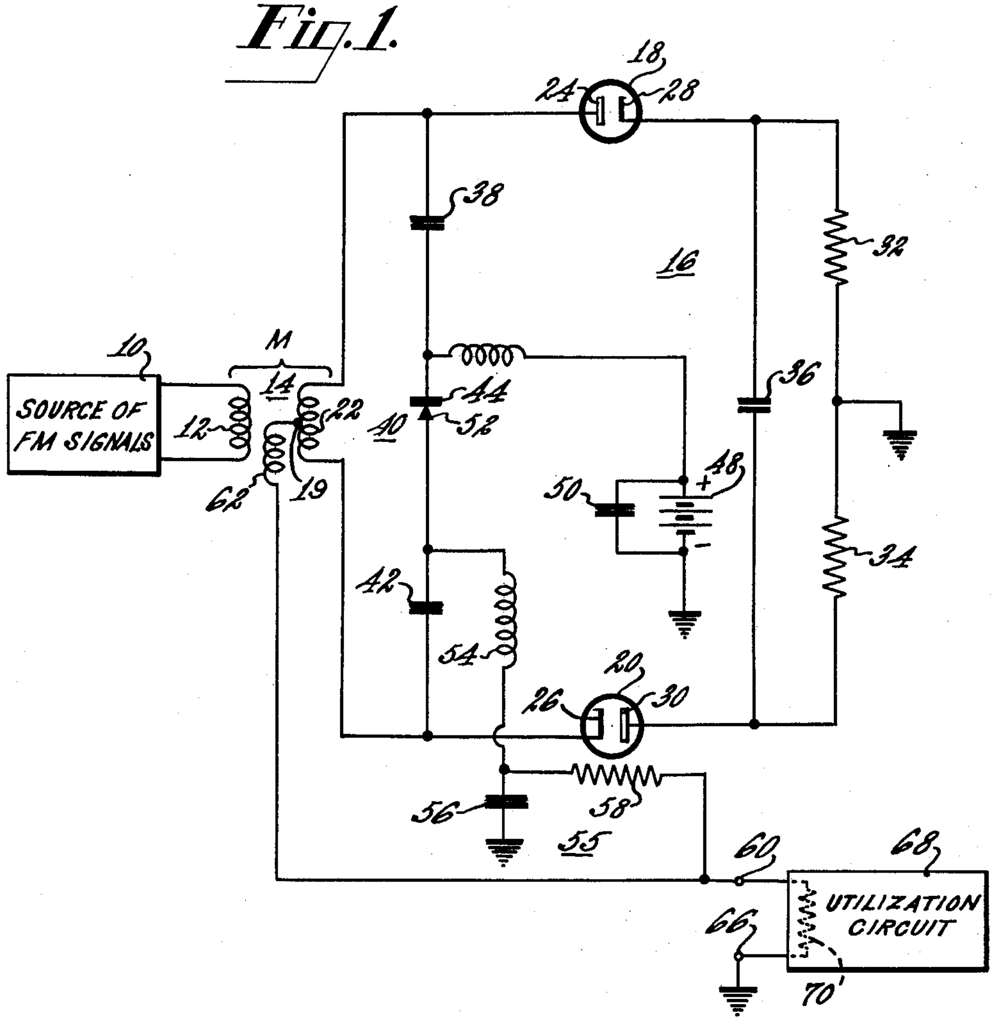
Figure 2:
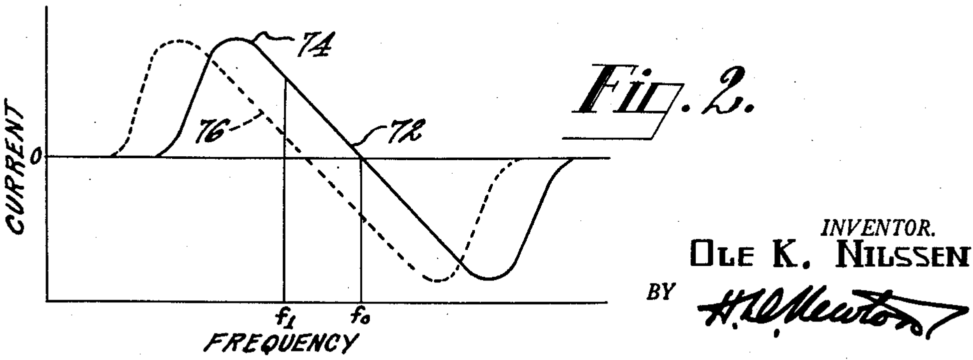

The invention will be further understood when the following description is read in connection with the accompanying drawings, in which:

Figure 1 is a schematic circuit diagram of an FM detector circuit embodying the invention, and Figure 2 is a graph showing curves illustrating certain operational features of the invention.

Referring now to the drawing, and particularly to Figure 1, FM signals are applied from a source of FM signals 10, which may be standard FM superheterodyne receiver or television receiver signal selecting and IF conversion means to the primary winding 12 of a tuned signal input transformer 14 of an FM detector circuit 16 utilizing a pair of diodes 18 and 20 as the rectifying elements. The circuit here illustrated is a ratio detector circuit; however, the invention is applicable to other FM detector circuits, such as an FM discriminator circuit. The FM signals are coupled from the secondary winding 22 of the transformer 14 to the diodes 18 and 20, one end of the secondary winding being connected to the anode 24 of the first diode 18 and the other end of the winding being connected to the cathode 26 of the second diode 20. The cathode 28 of the first diode and the anode 30 of the second diode 20 are connected through a pair of resistors 32 and 34 in parallel with a storage capacitor 36. The junction of the resistors 32 and 34 is connected to ground or a point of reference potential for the circuit.

The secondary winding 22 of the transformer 14 is connected in parallel with the series combination of a tuning capacitor 38, a crystal diode 40 and a blocking capacitor 42. As will be more fully explained hereinafter, the tuning capacitance for the transformer secondary 22 is effectively the series combination of the tuning capacitor 38 and the capacitance of the diode 40, the value of the blocking capacitor 42 being so large as to have no effect on the tuning of the circuit.

The diode 40 operates as a variable tuning capacitance across the secondary in series with the fixed capacitor 38. The cathode 44 of the diode is connected through a radio frequency choke coil 46 to the positive terminal of a source of potential 48, here illustrated as a battery. The choke coil 46 and a capacitor 40 shunted across the battery 48 serve to prevent any RF voltages from appearing in the battery 48. The anode 52 of the diode 40 is likewise connected through a second RF choke 54 and a filter circuit 55, comprising a shunt capacitor 56 and a series resistor 58, to one of the detector signal output terminals 60, the other terminal 66 being grounded. The detector output signal is derived through a circuit connection with a tertiary winding 62 of the signal input transformer 14. This winding 62 is connected in the usual manner to a center tap point 64 on the secondary 22 and is closely coupled inductively to the primary winding 12. The detected output signal of the ratio detector appears between the detected output terminal 60 and the ground terminal 66 and is applied to any utilization circuit 68. The input impedance means of the utilization circuit is represented by the dotted resistor 70 within the utilization circuit block and provides a ground return for the detector signal currents.

In operation, FM signals appearing at the primary winding 12 of the signal input transformer 14 are conveyed through the secondary winding 22 to the anode 24 of the first diode 18 and the cathode 26 of the second diode 20. A reference voltage is supplied by the tertiary winding 62 so that as the frequency of the FM signal shifts from its center value, the phase of the signal voltages with respect to the reference voltage applied to the anode 24 of the first diode 18 and the cathode 26 of the second diode 20 changes. The ratio of the voltages rectified by the diodes 18 and 20 provide a detected output signal at the signal output terminal 60, as is well known.

As previously mentioned, the reverse bias applied to the diode 40 provides a capacitance thereacross, which in combination with the tuning capacitor 38 tunes the secondary 22 of the transformer 14 to approximately the center frequency of the incoming wave. The capacitance across a crystal diode, such as germanium diodes commercially available as types 1N205 or 1N208, decreases as the reverse bias across the diode increases.

In accordance with the invention, the reverse bias on the diode 40 is automatically changed to insure that the secondary winding 22 is tuned close to the center frequency of the incoming FM signal by altering the voltage on the diode anode 52 in accordance with the average value of the detected output signal, which in the circuit illustrated will be a voltage varying in value according to the strength of the FM signal. To this end the detected output signal is applied from the output terminal 60 through the low pass filter network 55, comprising the filter resistor 58 and the filter capacitor 56, and the RF choke 54, to the anode 52 on the diode 40. The filter capacitor 56 and resistor 58 effectively prevent variations at the modulation frequency appearing in the detected output signal from being applied to the diode anode 52. The diode then receives only a steady D.-C. component of the detected voltage.

Referring now to Figure 2 in conjunction with Figure 1, assume that the received signal has a frequency $f_0$, as indicated in Figure 2. The responsive curve of the detector 16 is indicated by the solid curve 72. As the incoming frequency varies from its center frequency, $f_0$, according to the modulation signal, the detected output is derived from the variations in the output current. The average value of the output current, as will be seen from the curve 72, is zero, since the modulation will vary the value of the output current around this value. Since no D.-C. current then flows through the input resistance 70 of the utilization circuit 68, no D.-C. voltage will be developed to apply through the filter circuit 55 to the anode 52 of the diode 40 and the voltage on the anode 52 will thus be zero. The capacitance to tune the transformer secondary 22 will then be determined by the capacitor 38 in series with the capacitance of the diode 40 as set by a zero voltage on its anode 52 and the voltage of the battery 48 on its cathode 44.

Assume, now, that the frequency of the incoming signal shifts from $f_0$ to a lower frequency $f_1$. It will be seen that if the response curve 72 were to determine the detected output signal, that is, if the tuning of the transformer secondary 22 were not adjusted, the variations in frequency below the new center frequency $f_1$ could drive the output of the detector circuit 16 past the knee 74 of the curve 72 and cause distortion in the detected output signal and other deleterious effects. However, the average value of the detected output current increases at the frequency $f_1$ to a positive value. As the average value of the output current increases in a positive direction, the voltage drop across the input impedance 70 to the utilization circuit 68 becomes positive and a positive potential is applied through the filter network to the anode 52 of the diode 40. The reverse bias across the diode 40 is decreased, and as mentioned before, such action increases the capacitance across the diode 40, thus increasing the entire capacitance across the transformer secondary 22 and tuning the secondary 22 to a slightly lower frequency. The response curve of the detected output signal from the detector 16 will then correspond to the dotted curve 76 shown in Figure 2. It will be noted that the transformer will not be tuned to exactly the lower frequency $f_1$. There will be a slight error voltage produced since the frequency $f_1$ is not at the point where the new tuned curve 76 crosses the zero current axis. This slight error voltage maintains the circuit tuned to the lower value close to, but not exactly at, the lower frequency, $f_1$. Of course, only a portion of the average detected output voltage may be applied to the diode anode 52 if the entire potential causes an unduly large change in the capacitance across the diode 40.

If the center frequency of the FM signal increases the opposite action occurs, that is, as the output current increases negatively, negative voltage is then applied to the diode anode 52 causing a larger reverse bias voltage to be applied to the diode anode 52, which, of course, decreases its capacitance and tunes the transformer secondary 22 to a slightly higher frequency.

Thus, a self tuning circuit for an FM detector, in accordance with the invention, allows the input circuit of the detector to be tuned automatically toward the incoming signal and to center its tuning close to the center frequency of the received signal. The frequency drift of the local oscillator in an FM superheterodyne receiver is less critical and the tuning of the receiver is greatly facilitated. The invention may also find important and extensive use in signal seeking systems and in signal recording devices which operate over a large range.

What is claimed is:

1. A self-tuning frequency-modulation detector comprising in combination, a signal input transformer having primary and secondary windings, a pair of rectifying elements connected to said secondary winding, means for applying a frequency-modulation signal to said primary winding, means connected to provide a reference signal voltage for said rectifying elements from said primary winding whereby out-of-phase signal voltages are applied to said rectifying elements from said secondary winding as the frequency of said frequency-modulation signal deviates from the center frequency thereof, means including a signal output circuit for deriving a detected modulation signal current from said rectifying elements, means including a crystal diode connected with the secondary winding for variably tuning said winding, reverse bias supply means for the diode having a potential value and polarity relation thereto for effecting center-frequency tuning of said secondary winding, and output circuit impedance means responsive to variations in the average value of the detected modulation signal current with applied signal frequency deviations from said center frequency connected in circuit with said diode for varying the effective bias potential applied thereto and the tuning of the secondary winding with and in the direction of said signal frequency deviations, thereby to maintain the tuning of the secondary winding near the center frequency of an applied signal.

2. A self-tuning ratio detector circuit, comprising in combination, a signal input transformer having a primary, secondary and tertiary windings, a pair of rectifying elements each having a cathode and an anode, means connecting one end of said secondary winding to the anode of a first of said rectifying elements and the other end of said secondary winding to the cathode of the second of said rectifying elements, conductive impedance means connecting the cathode of said first rectifying element with the anode of said second rectifying element, means for applying a frequency-modulation signal to said primary winding, means connecting said tertiary winding to supply a reference signal to said rectifying elements, means including a signal output circuit connected for deriving a detected modulation signal current from said rectifying elements through said conductive impedance means and said tertiary winding, a tuning capacitor for said secondary winding connected to one end of said winding, a crystal diode connected serially with said tuning capacitor to the other end of said winding, a blocking capacitor in said last named connection, reverse bias supply means for the diode having a potential value and polarity relation thereto for effecting center-frequency tuning of said secondary winding jointly with said tuning capacitor, and output circuit impedance means responsive to variations in the average value of the detected modulation signal current with applied signal frequency variations from said center frequency connected in circuit with said diode for varying the effective bias potential applied thereto in direction and magnitude to shift the tuning of the secondary winding with and in the direction of said signal frequency variations, thereby to maintain the tuning of the secondary winding near the center frequency of an applied signal.

3. A self-tuning ratio detector circuit for frequency-modulation signals comprising in combination, a signal input transformer having primary and secondary windings, means for applying a frequency-modulation input signal to said primary winding, means connected with the secondary winding for applying a reference voltage from the primary winding to said secondary winding to develop a pair of out-of-phase voltages in said secondary winding corresponding to the deviation of an applied frequency-modulation signal from its center frequency, a pair of rectifying elements each having a cathode and an anode, means connecting one end of said secondary winding to the anode of one of said rectifying elements and the other end of said secondary winding to the cathode of the other of said rectifying elements, conductive impedance means connecting the cathode of said one of the rectifying elements with the anode of said other of the rectifying elements, means including a signal output circuit connected for deriving a detected modulation signal current from said rectifying elements, means including a crystal diode connected with the secondary winding for variably tuning said winding, a bias supply circuit connected with the diode and including reverse-bias supply means for the diode having a potential value and polarity relation thereto for effecting center-frequency tuning of said secondary winding, and output circuit impedance means responsive to variations in the average value of the detected modulation signal current with applied signal frequency deviations from said center frequency connected in circuit with said diode for varying the effective bias potential applied thereto in direction and magnitude to shift the tuning of the secondary winding with and in the direction of said signal frequency deviations, thereby to maintain the tuning of the secondary winding near the center frequency of an applied signal.

References Cited in the file of this patent

UNITED STATES PATENTS

| | | |
|---|---|---|
| 2,182,377 | Guanella | Dec. 5, 1939 |
| 2,496,063 | Mural | Jan. 31, 1950 |
| 2,561,089 | Anderson | July 17, 1951 |
| 2,595,441 | Avins | May 6, 1952 |